(12) United States Patent
Hsaio et al.

(10) Patent No.: US 10,978,462 B2
(45) Date of Patent: *Apr. 13, 2021

(54) METHOD FOR FORMING SEMICONDUCTOR DEVICE STRUCTURE

(71) Applicant: Taiwan Semiconductor Manufacturing Co., Ltd, Hsinchu (TW)

(72) Inventors: Ching-Yen Hsaio, Tainan (TW); Cheng-Ming Wu, Tainan (TW); Shih-Lu Hsu, Tainan (TW); Chien-Hsian Wang, Minxiong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 70 days.

This patent is subject to a terminal disclaimer.

(21) Appl. No.: 16/662,941

(22) Filed: Oct. 24, 2019

(65) Prior Publication Data

US 2020/0058661 A1 Feb. 20, 2020

Related U.S. Application Data

(60) Continuation of application No. 15/941,669, filed on Mar. 30, 2018, now Pat. No. 10,461,088, which is a division of application No. 14/832,659, filed on Aug. 21, 2015, now Pat. No. 9,941,294.

(51) Int. Cl.
| | | |
|---|---|---|
| *H01L 21/027* | (2006.01) | |
| *H01L 27/11521* | (2017.01) | |
| *H01L 29/06* | (2006.01) | |
| *H01L 21/28* | (2006.01) | |
| *H01L 29/423* | (2006.01) | |
| *H01L 29/66* | (2006.01) | |

(Continued)

(52) U.S. Cl.
CPC .... *H01L 27/11521* (2013.01); *H01L 21/0273* (2013.01); *H01L 21/0276* (2013.01); *H01L 21/28008* (2013.01); *H01L 21/32139* (2013.01); *H01L 29/0649* (2013.01); *H01L 29/40114* (2019.08); *H01L 29/42324* (2013.01); *H01L 29/66825* (2013.01); *H01L 29/7881* (2013.01)

(58) Field of Classification Search
CPC ...................... H01L 21/0273; H01L 21/32139
See application file for complete search history.

(56) References Cited

U.S. PATENT DOCUMENTS

| | | |
|---|---|---|
| 5,538,912 A | 7/1996 | Kunori et al. |
| 5,804,479 A | 9/1998 | Aoki et al. |
| 6,316,314 B1 | 11/2001 | Ishige |

(Continued)

*Primary Examiner* — Latanya N Crawford Eason
(74) *Attorney, Agent, or Firm* — Birch, Stewart, Kolasch & Birch, LLP

(57) ABSTRACT

A method for forming a semiconductor device structure is provided. The method includes forming a gate stack and a conductive layer over a semiconductor substrate. The method includes forming a negative photoresist layer to cover the gate stack and a first portion of the conductive layer over the isolation structure and expose a second portion of the conductive layer. The method includes forming a mask layer over the negative photoresist layer and the conductive layer. The mask layer has trenches over the second portion of the conductive layer and an edge portion of the negative photoresist layer, and a thickness of the edge portion decreases in a direction away from the gate stack.

20 Claims, 16 Drawing Sheets

(51) Int. Cl.
    *H01L 29/788*     (2006.01)
    *H01L 21/3213*     (2006.01)

(56) References Cited

U.S. PATENT DOCUMENTS

| | | |
|---|---|---|
| 6,346,366 B1 | 2/2002 | Chu et al. |
| 6,579,790 B1 | 6/2003 | Huang et al. |
| 6,762,477 B2 | 7/2004 | Kunikiyo |
| 6,930,348 B2 | 8/2005 | Wang |
| 7,598,174 B1 | 10/2009 | Zhuang |
| 8,445,953 B2 | 5/2013 | Shen et al. |
| 8,907,395 B2 | 12/2014 | Hsu et al. |
| 9,082,630 B2 | 7/2015 | Chuang et al. |
| 9,397,228 B2 | 7/2016 | Wu et al. |
| 9,922,986 B2 | 3/2018 | Richter et al. |
| 2004/0042285 A1 | 3/2004 | Yoshizawa et al. |
| 2004/0259298 A1 | 12/2004 | Graf et al. |
| 2005/0127473 A1 | 6/2005 | Sakagami |
| 2008/0020525 A1 | 1/2008 | Lo et al. |
| 2008/0286698 A1 | 11/2008 | Zhuang et al. |
| 2009/0218640 A1 | 9/2009 | Hampp |
| 2013/0043522 A1 | 2/2013 | Hsu et al. |
| 2013/0149851 A1 | 6/2013 | Li et al. |
| 2013/0168767 A1 | 7/2013 | Lin et al. |
| 2015/0084111 A1 | 3/2015 | Wu et al. |
| 2016/0133637 A1 | 5/2016 | Wu et al. |
| 2016/0172359 A1 | 6/2016 | Yoon et al. |

METHOD FOR FORMING SEMICONDUCTOR DEVICE STRUCTURE

CROSS REFERENCE

This application is a Continuation of U.S. application Ser. No. 15/941,669, filed on Mar. 30, 2018, which is a Divisional of U.S. application Ser. No. 14/832,659, filed on Aug. 21, 2015, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
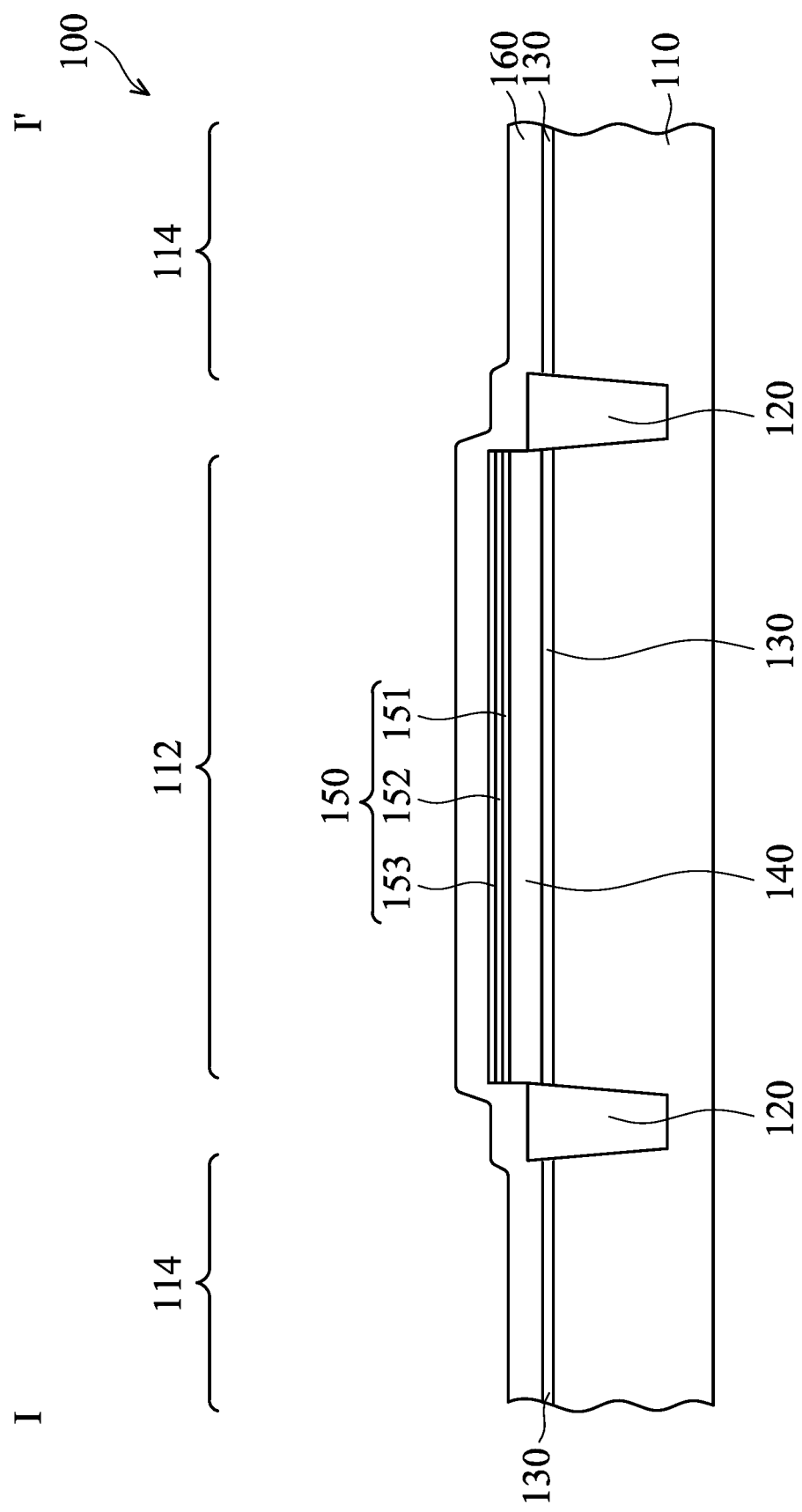
FIGS. 1A-1M are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1M are cross-sectional views of various stages of a process for forming a semiconductor device structure 100, in accordance with some embodiments. FIG. 2A is a top view of the semiconductor device structure 100 of FIG. 1A, in accordance with some embodiments. FIG. 1A is a cross-sectional view illustrating the semiconductor device structure 100 along a sectional line I-I' in FIG. 2A, in accordance with some embodiments.

As shown in FIGS. 1A and 2A, a semiconductor substrate 110 is provided. The semiconductor substrate 110 includes a semiconductor wafer (such as a silicon wafer) or a portion of a semiconductor wafer. In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor such as silicon carbide, gallium arsenide, gallium phosphide, indium phosphide, indium arsenide, an alloy semiconductor such as SiGe, or GaAsP, or a combination thereof. In some embodiments, the semiconductor substrate 110 includes multi-layer semiconductors, semiconductor-on-insulator (SOI) (such as silicon-on-insulator or germanium-on-insulator), or a combination thereof.

As shown in FIG. 1A, an isolation structure 120 is formed in the semiconductor substrate 110, in accordance with some embodiments. The isolation structure 120 includes a shallow trench isolation (STI) structure, in accordance with some embodiments. The isolation structure 120 is embedded in the semiconductor substrate 110, in accordance with some embodiments. The isolation structure 120 is configured to define and electrically isolate various device elements or device regions formed in the semiconductor substrate 110, in accordance with some embodiments.

Examples of the various device regions include a memory-cell region 112 and logic regions 114, in accordance with some embodiments. The isolation structure 120 surrounds the memory-cell region 112 and the logic regions 114, in accordance with some embodiments. The memory-cell region 112 and the logic regions 114 are separated from each other by the isolation structure 120, in accordance with some embodiments. The isolation structure 120 electrically isolates device elements formed over the memory-cell region 112 from device elements formed over the logic regions 114, in accordance with some embodiments.

Examples of the device elements include memory cells, transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

The isolation structure 120 is made of a dielectric material, in accordance with some embodiments. The dielectric material includes silicon oxide, silicon nitride, silicon oxynitride, fluoride-doped silicate glass (FSG), a low-K dielectric material, other suitable materials, or combinations thereof, in accordance with some embodiments. The isolation structure 120 is formed by using an isolation technology, such as local oxidation of semiconductor (LOCOS), shallow trench isolation (STI), or the like, in accordance with some embodiments.

In some embodiments, the formation of the isolation structure 120 includes patterning the semiconductor substrate 110 by performing a photolithography process and an etching process on the semiconductor substrate 110 so as to form a trench in the semiconductor substrate 110; and filling the trench with the dielectric material.

The etching process for forming the trench includes a dry etching process, a wet etching process, a plasma etching process, or a combination thereof, in accordance with some embodiments. The filling of the trench includes a chemical vapor deposition process, in accordance with some embodiments. In some embodiments, the filled trench has a multi-layer structure, such as a thermal oxide liner layer filled with silicon nitride or silicon oxide.

As shown in FIG. 1A, a gate dielectric material layer 130 is formed over the semiconductor substrate 110, in accordance with some embodiments. The gate dielectric material layer 130 is made of silicon oxide, in accordance with some embodiments. The gate dielectric material layer 130 is formed using a thermal oxidation process or another suitable process.

As shown in FIG. 1A, a gate material layer 140 is formed over the gate dielectric material layer 130 over the memory-cell region 112, in accordance with some embodiments. In some embodiments, the gate material layer 140 is also referred to as a floating gate material layer.

The gate material layer 140 is made of polysilicon, in accordance with some embodiments. The gate material layer 140 is formed using a deposition process, a photolithography process, and an etching process, in accordance with some embodiments. The deposition process includes a chemical vapor deposition process, in accordance with some embodiments.

As shown in FIG. 1A, a dielectric structure 150 is formed over the gate material layer 140, in accordance with some embodiments. The dielectric structure 150 includes a silicon dioxide layer 151, a silicon nitride layer 152, and a silicon dioxide layer 153, in accordance with some embodiments. The silicon nitride layer 152 is positioned between the silicon dioxide layers 151 and 153, in accordance with some embodiments.

The dielectric structure 150 is also referred to as an ONO (oxide/nitride/oxide) layer, in accordance with some embodiments. In some other embodiments, the dielectric structure 150 includes other suitable materials. The silicon dioxide layer 151, the silicon nitride layer 152, and the silicon dioxide layer 153 are formed using deposition processes, a photolithography process, and an etching process, in accordance with some embodiments. The deposition processes include a chemical vapor deposition process, in accordance with some embodiments.

As shown in FIG. 1A, a gate material layer 160 is deposited over the dielectric structure 150, the isolation structure 120, and the gate dielectric material layer 130 over the logic regions 114, in accordance with some embodiments. The gate material layer 160 includes a conductive layer, in accordance with some embodiments.

The gate material layer 160 is made of a conductive material, in accordance with some embodiments. The gate material layer 160 is made of polysilicon, in accordance with some embodiments. The gate material layer 160 is deposited using a chemical vapor deposition process, in accordance with some embodiments.

Figure 1B:
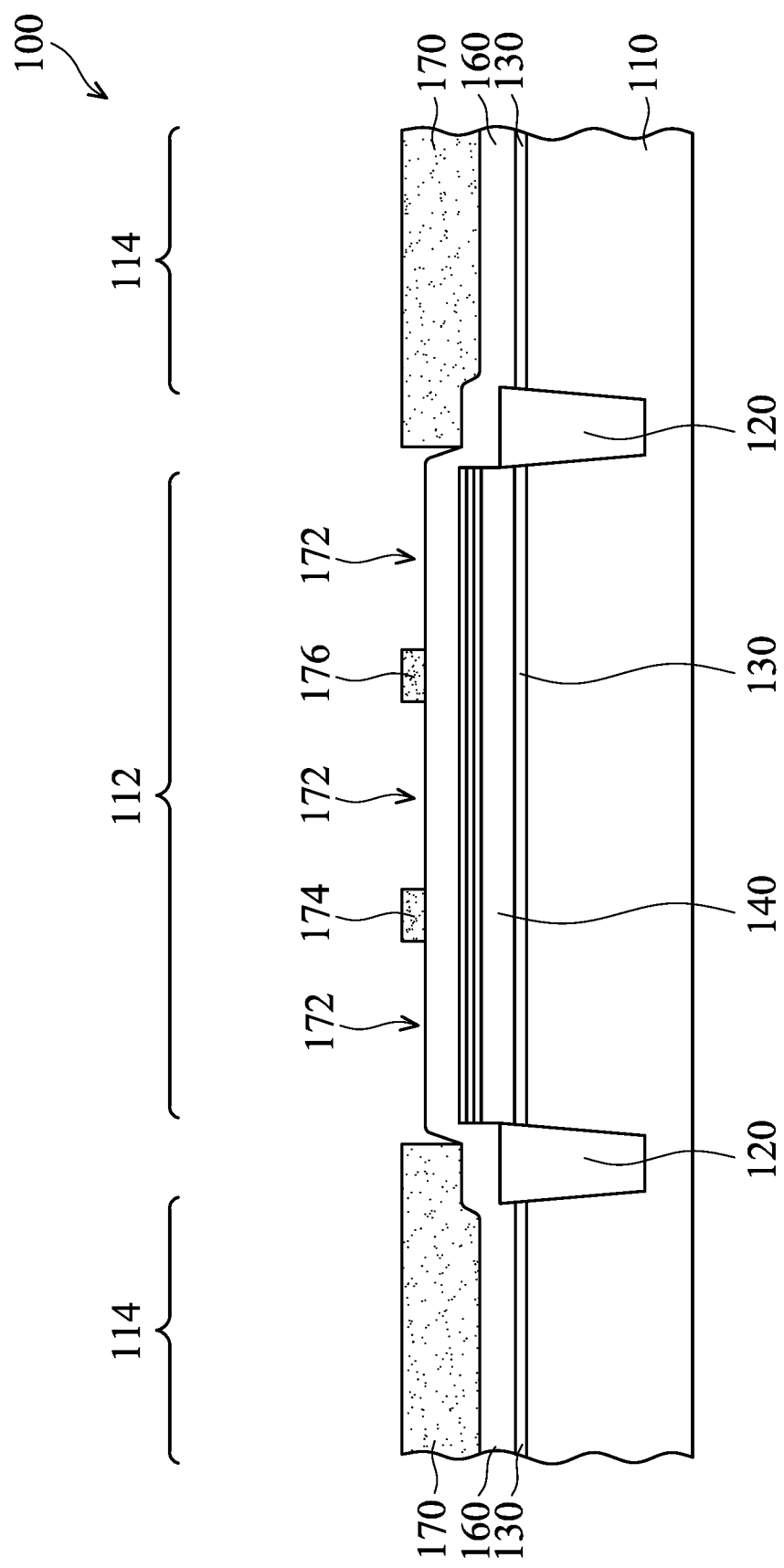
Figure 2A:
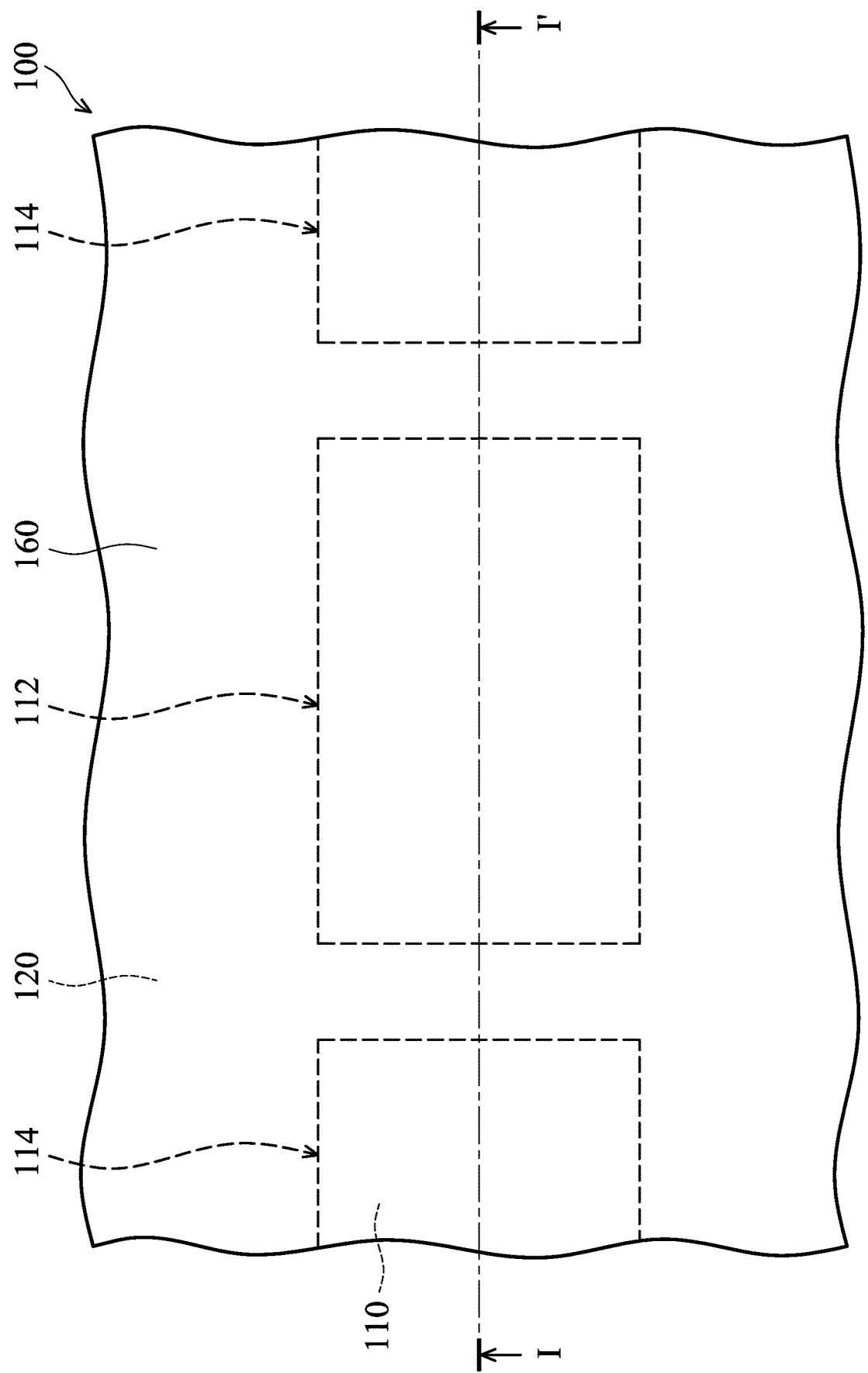
FIG. 2A is a top view of the semiconductor device structure of FIG. 1A, in accordance with some embodiments.

As shown in FIG. 1B, a mask layer 170 is formed over the gate material layer 160, in accordance with some embodiments. The mask layer 170 has openings 172 exposing a portion of the gate material layer 160 over or adjacent to the memory-cell region 112, in accordance with some embodiments. The mask layer 170 has portions 174 and 176 over the memory-cell region 112, in accordance with some embodiments. The portions 174 and 176 are spaced apart from each other, in accordance with some embodiments.

The mask layer 170 is configured to be an etching mask, in accordance with some embodiments. The mask layer 170 is also configured to protect the gate material layer 160 thereunder from damage during the subsequent processes, in accordance with some embodiments.

In some embodiments, the mask layer 170 includes nitride, such as silicon nitride, silicon oxynitride, or the like. The mask layer 170 is formed by a depositing process, a photolithography process, and an etching process, in accordance with some embodiments. The deposition process includes a chemical vapor deposition process, in accordance with some embodiments. The etching process includes a dry etching process, in accordance with some embodiments.

Figure 1C:
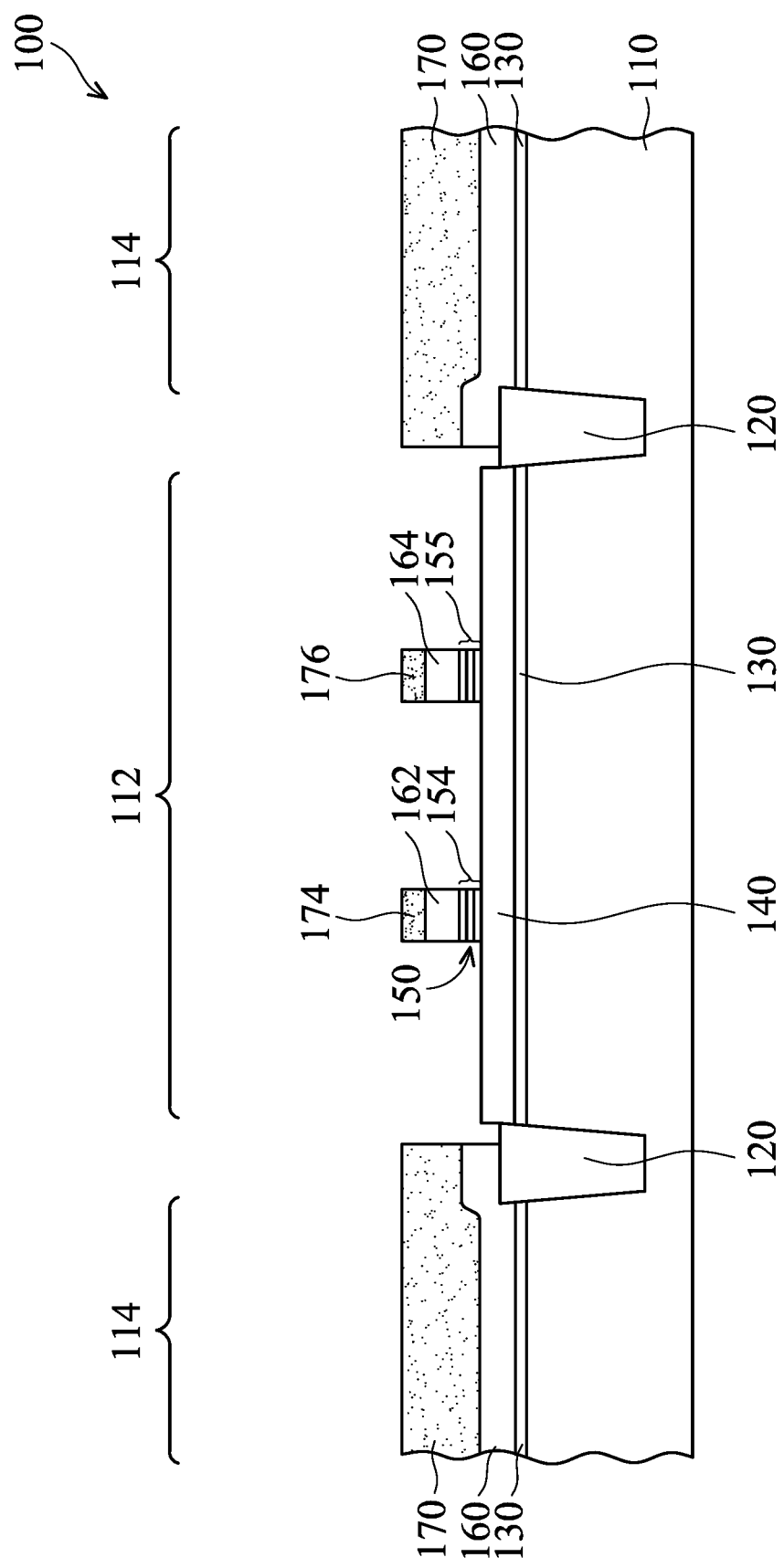

As shown in FIG. 1C, an etching process is performed on the gate material layer 160 and the dielectric structure 150 using the mask layer 170 as an etching mask, in accordance with some embodiments. The etching process includes a dry etching process, in accordance with some embodiments.

After the etching process, the remaining gate material layer 160 over the memory-cell region 112 includes control gates 162 and 164 separated from each other, in accordance with some embodiments. The remaining dielectric structure 150 includes dielectric layers 154 and 155 separated from each other, in accordance with some embodiments. The control gates 162 and 164 are covered by the portions 174 and 176 respectively, in accordance with some embodiments.

Figure 1D:
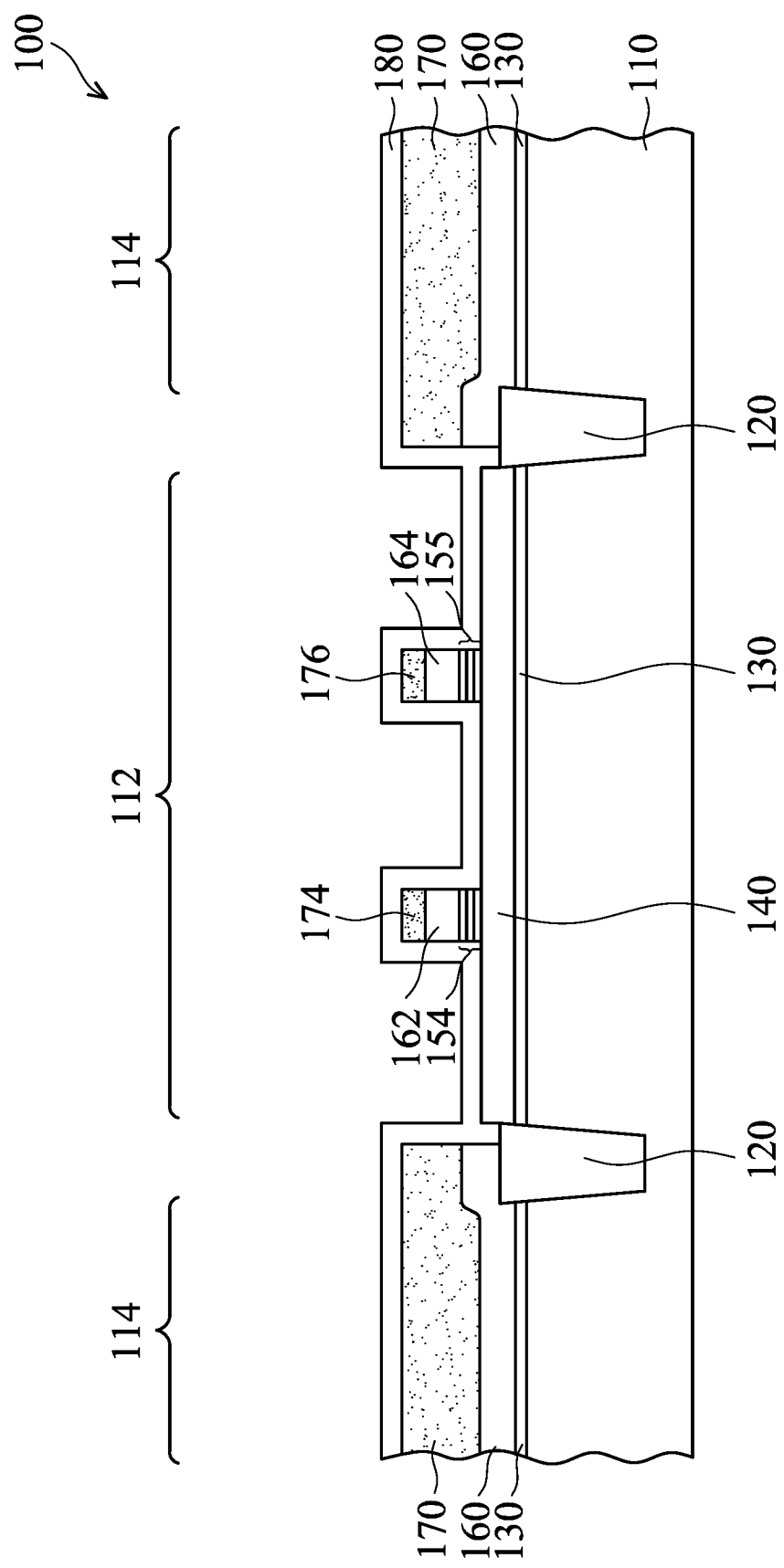

As shown in FIG. 1D, a dielectric layer 180 is deposited over the semiconductor substrate 110 to cover the dielectric layers 154 and 155, the control gates 162 and 164, the mask layer 170, the isolation structure 120, and the gate material layer 140, in accordance with some embodiments. The dielectric layer 180 includes an ONO (oxide/nitride/oxide) layer, in accordance with some embodiments. In some other embodiments, the dielectric layer 180 includes other suitable materials. The dielectric layer 180 are formed using chemical vapor deposition processes, in accordance with some embodiments.

Figure 1E:
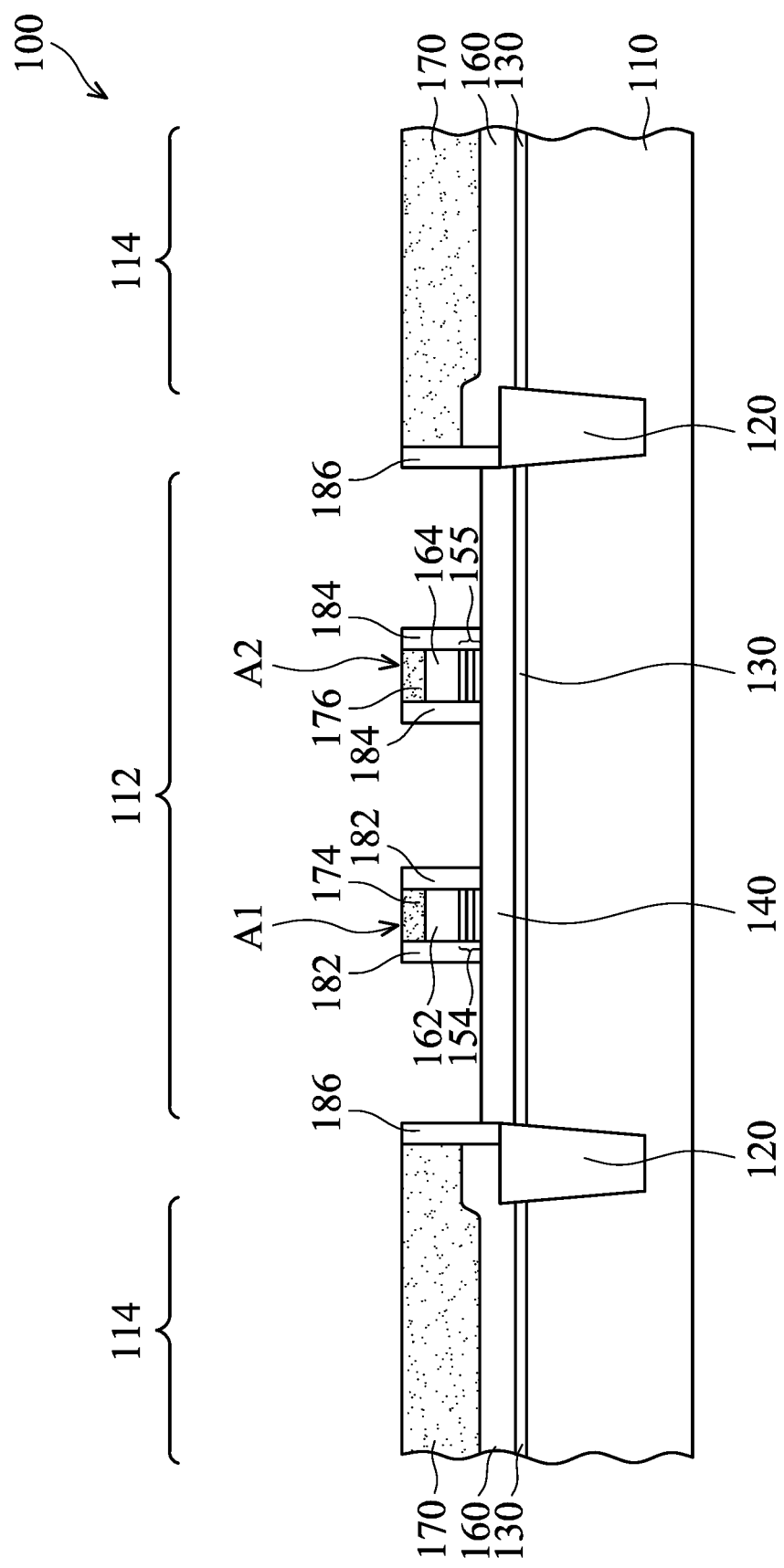

As shown in FIG. 1E, a portion of the dielectric layer 180 is removed, in accordance with some embodiments. The portion of the dielectric layer 180 is removed using an anisotropic etching process, in accordance with some embodiments. The anisotropic etching process includes a dry etching process, in accordance with some embodiments.

The remaining dielectric layer 180 includes spacers 182, 184, and 186 spaced apart from each other, in accordance with some embodiments.

In some embodiments, a stack A1 includes the dielectric layer 154, the control gate 162, and the portion 174 of the mask layer 170. The spacers 182 are located over sidewalls of the stack A1, in accordance with some embodiments. In some embodiments, a stack A2 includes the dielectric layer 155, the control gate 164, and the portion 176 of the mask layer 170. The spacers 184 are located over sidewalls of the stack A2, in accordance with some embodiments.

Figure 1F:
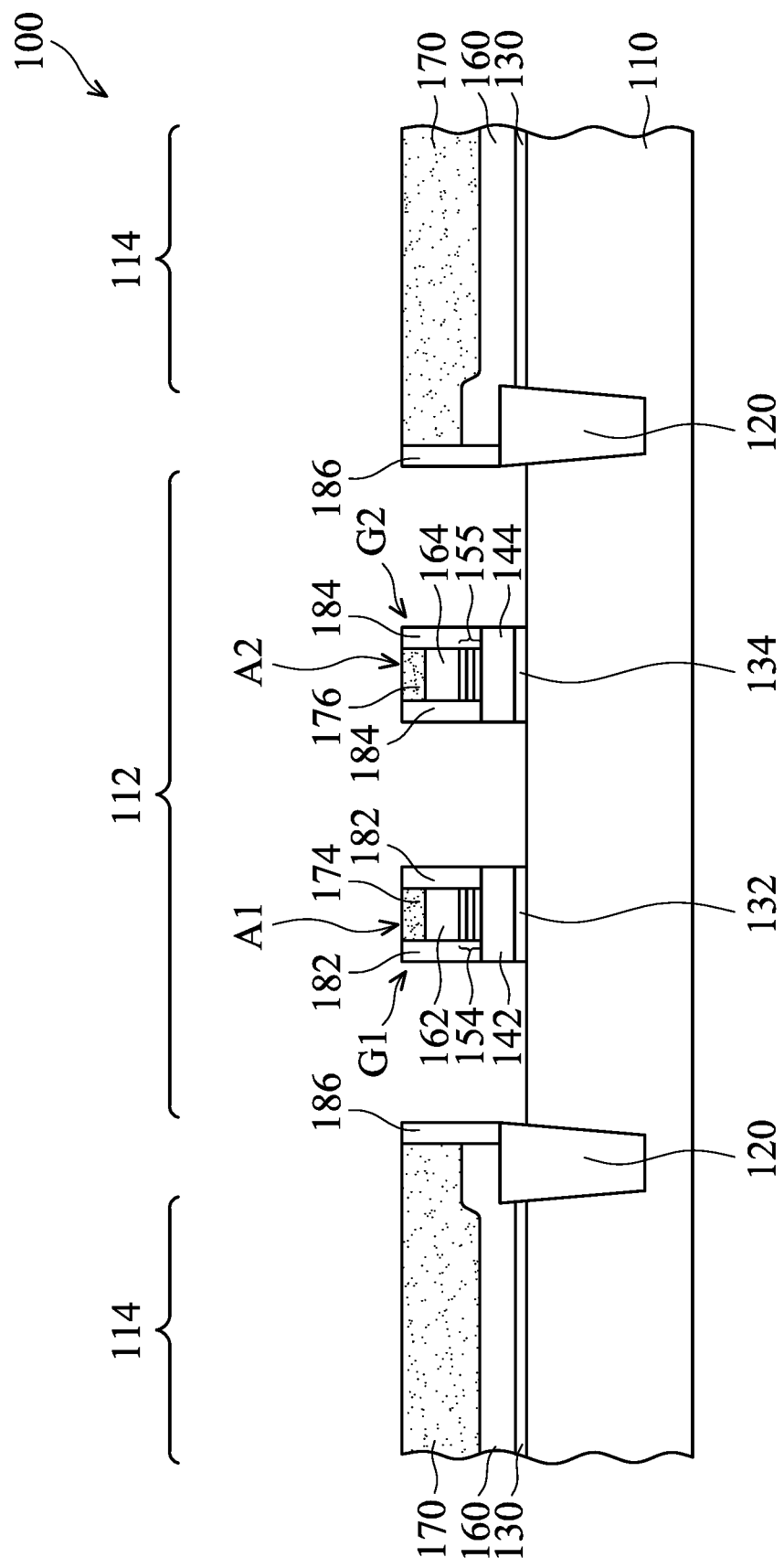

As shown in FIG. 1F, portions of the gate material layer 140 and the gate dielectric material layer 130 are removed, in accordance with some embodiments. The removal process includes a dry etching process using the stacks A1 and A2 as an etching mask, in accordance with some embodiments. After the removal process, the remaining gate material layer 140 includes floating gates 142 and 144 separated from each other, in accordance with some embodiments.

The control gate 162 is located over the floating gate 142, in accordance with some embodiments. The control gate 162 and the floating gate 142 are electrically isolated from each other, in accordance with some embodiments. The control gate 164 is located over the floating gate 144, in accordance with some embodiments. The control gate 164 and the floating gate 144 are electrically isolated from each other, in accordance with some embodiments. The remaining gate dielectric material layer 130 includes gate dielectric layers 132 and 134 separated from each other, in accordance with some embodiments.

In some embodiments, a gate stack G1 including the floating gate 142, the dielectric layer 154, and the control gate 162 is formed. In some embodiments, the gate stack G1 further includes the gate dielectric layer 132, the mask layer 174, and the spacers 182. In some embodiments, a gate stack G2 including the floating gate 144, the dielectric layer 155, and the control gate 164 is formed. In some embodiments, the gate stack G2 further includes the gate dielectric layer 134, the mask layer 176, and the spacers 184.

Figure 1G:
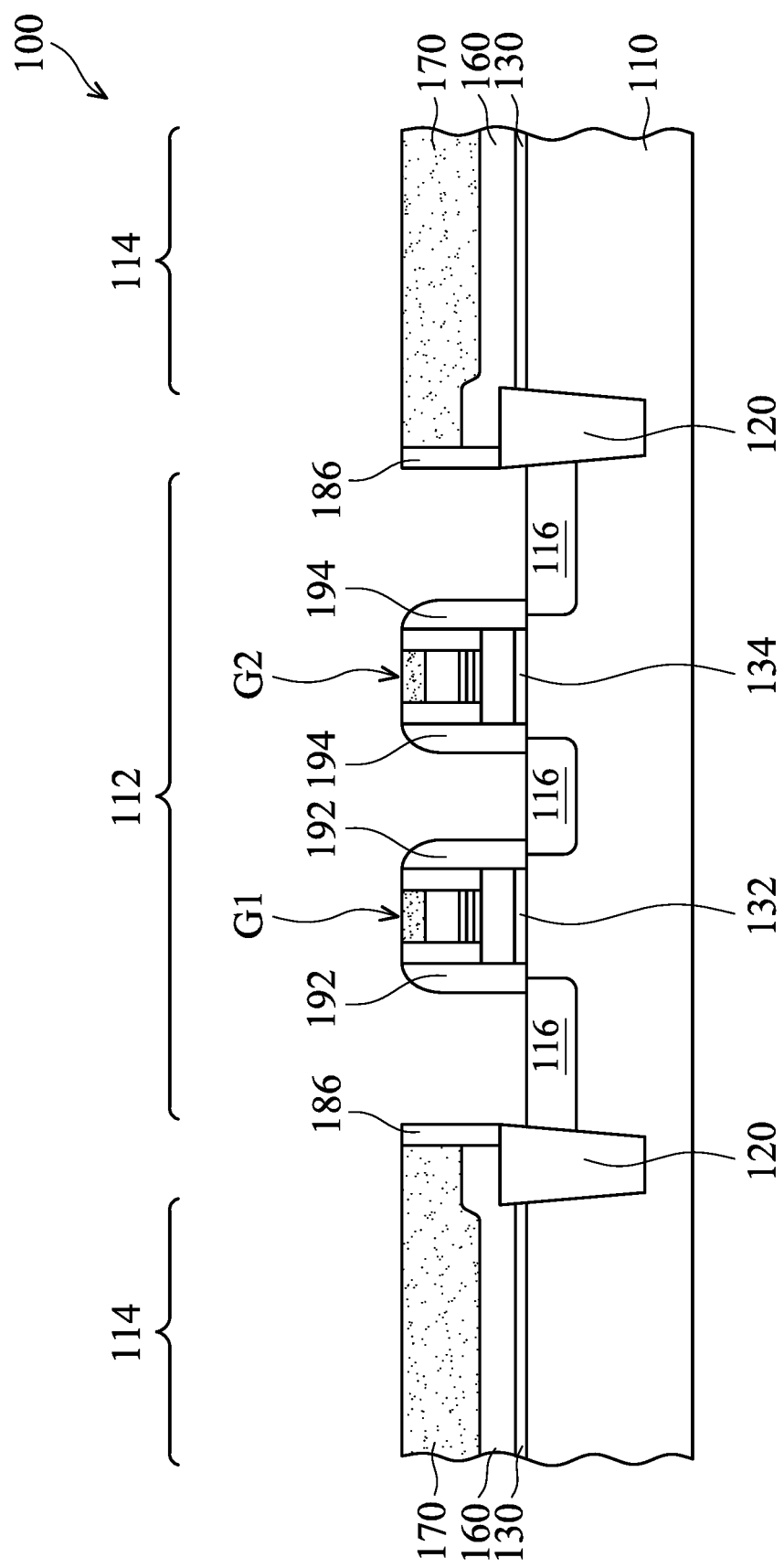

As shown in FIG. 1G, spacers 192 and spacers 194 are formed over sidewalls of the gate stacks G1 and G2 respectively, in accordance with some embodiments. The spacers 192 and 194 include oxide, such as silicon oxide, in accordance with some embodiments. The spacers 192 and 194 are formed using a deposition process and an etching process, in accordance with some embodiments. The etching process includes a dry etching process, in accordance with some embodiments.

As shown in FIG. 1G, doped regions 116 are formed in the semiconductor substrate 110 in the memory-cell region 112 and exposed by the gate stacks G1 and G2, in accordance with some embodiments. The doped regions 116 are doped with n-type impurities (e.g., phosphorus) or p-type impurities (e.g., boron), in accordance with some embodiments. The doped regions 116 are formed using, for example, an ion implantation process.

Figure 1H:
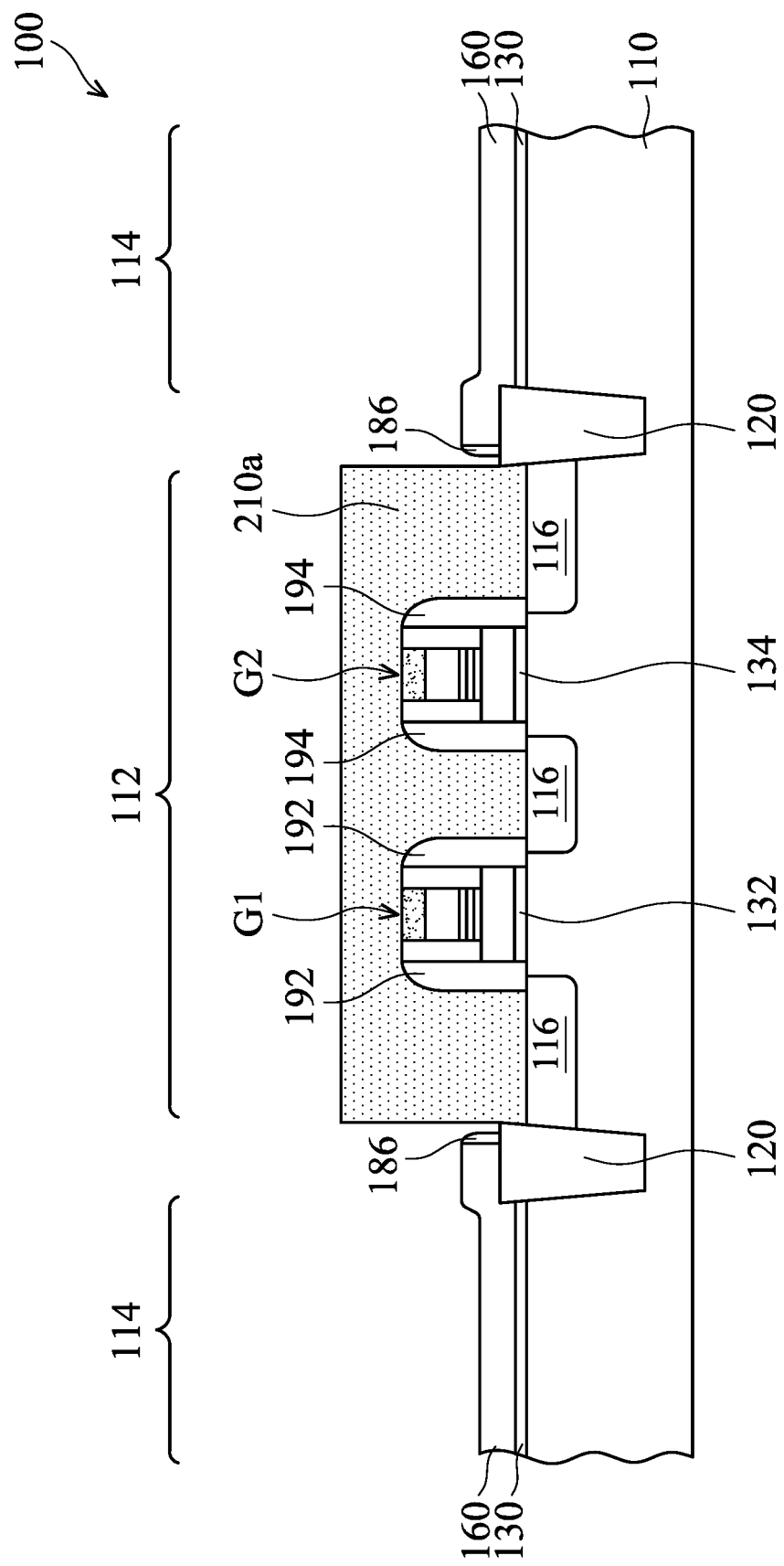

As shown in FIG. 1H, the mask layer 170 over the logic region 114 and the isolation structure 120 is removed, in accordance with some embodiments. The spacers 186 over the mask layer 170 are removed as well, in accordance with some embodiments. As shown in FIG. 1H, a negative photoresist material layer 210a is formed over the memory-cell region 112 to cover the gate stacks G1 and G2 and the spacers 192 and 194, in accordance with some embodiments. The negative photoresist material layer 210a is configured to protect the gate stacks G1 and G2 (and the memory-cell region 112) during subsequent processes, in accordance with some embodiments.

The negative photoresist material layer 210a is formed using a deposition process, an exposure process, and a development process, in accordance with some embodiments. The negative photoresist material layer 210a includes a negative photoresist material, which has an exposed cross-linkable functionality, in accordance with some embodiments.

The negative photoresist material contributes to a cross-linking reaction in the exposure process. In the development process, the negative photoresist material layer in unexposed portions (not shown) is removed by a developer solution, in accordance with some embodiments. The development effect of the negative photoresist material is better than the development effect of a positive photoresist material, in accordance with some embodiments.

Figure 1I:
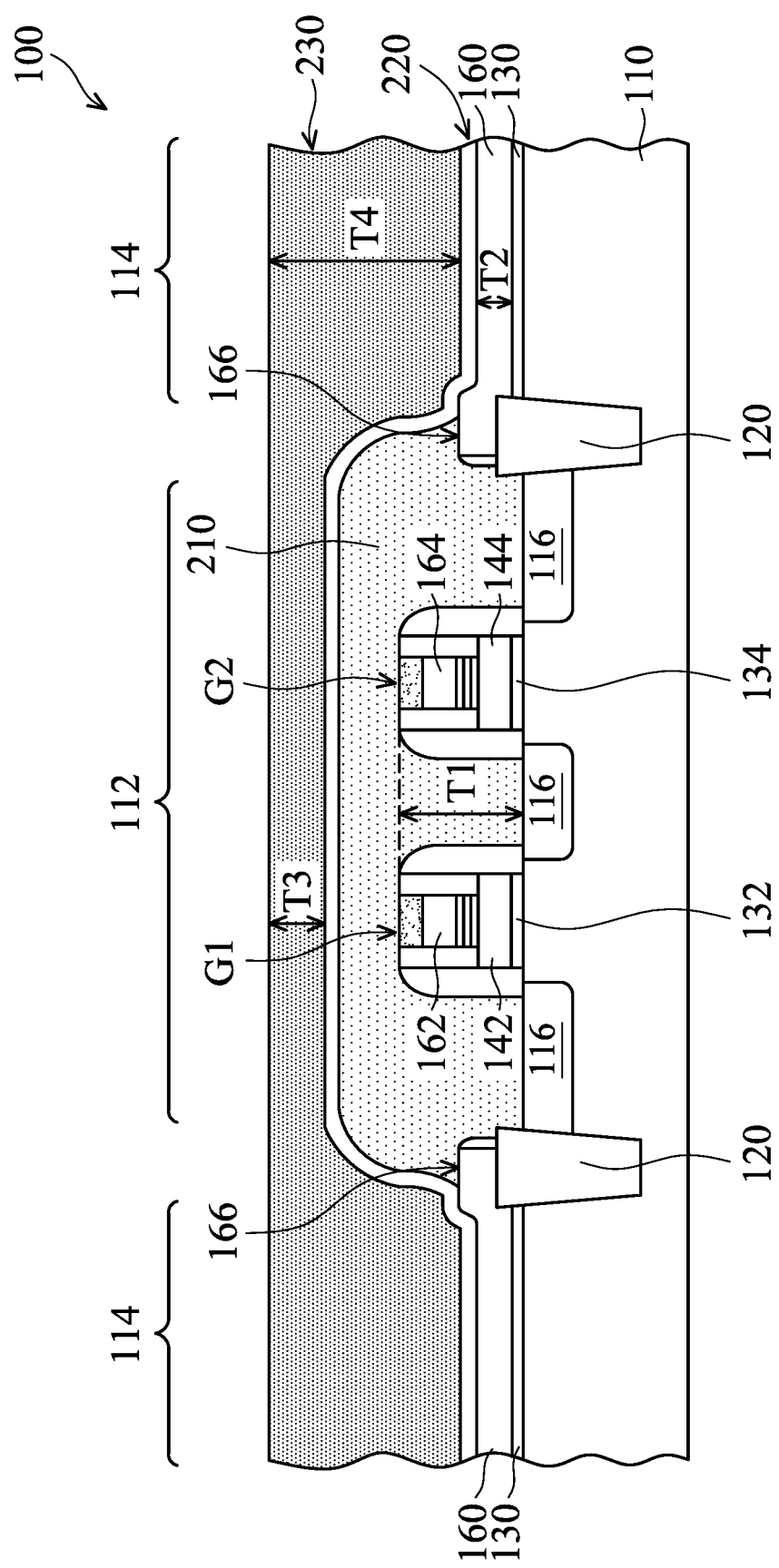

As shown in FIG. 1I, a baking process is performed on the negative photoresist material layer 210a to solidify the negative photoresist material layer 210a into a negative photoresist layer 210, in accordance with some embodiments. During the baking process, a portion of the negative photoresist material layer 210a flows onto a top surface 166 of the gate material layer 160 over the isolation structure 120, in accordance with some embodiments. Therefore, the negative photoresist layer 210 covers the top surface 166 of the gate material layer 160 over the isolation structure 120 as well, in accordance with some embodiments. In some embodiments, a baking temperature of the baking process ranges from about 195° C. to about 235° C.

As shown in FIG. 1I, an anti-reflective layer 220 is formed over the negative photoresist layer 210 and the gate material layer 160, in accordance with some embodiments. The anti-reflective layer 220 includes a polymer material (such as a bottom anti-reflective coating material) or another suitable material. The anti-reflective layer 220 is formed using a spin coating process or another suitable process.

As shown in FIG. 1I, a mask layer 230 is formed over the anti-reflective layer 220, in accordance with some embodiments. The mask layer 230 includes a photoresist layer, in accordance with some embodiments. The mask layer 230 is formed using a spin coating process or another suitable process.

Since the thickness T1 of the gate stack G1 or G2 is greater than the thickness T2 of the gate material layer 160 in the logic region 114, the thickness T3 of the mask layer 230 over the gate stack G1 or G2 is less than the thickness T4 of the mask layer 230 over the gate material layer 160 over the logic region 114, in accordance with some embodiments.

Figure 1J:
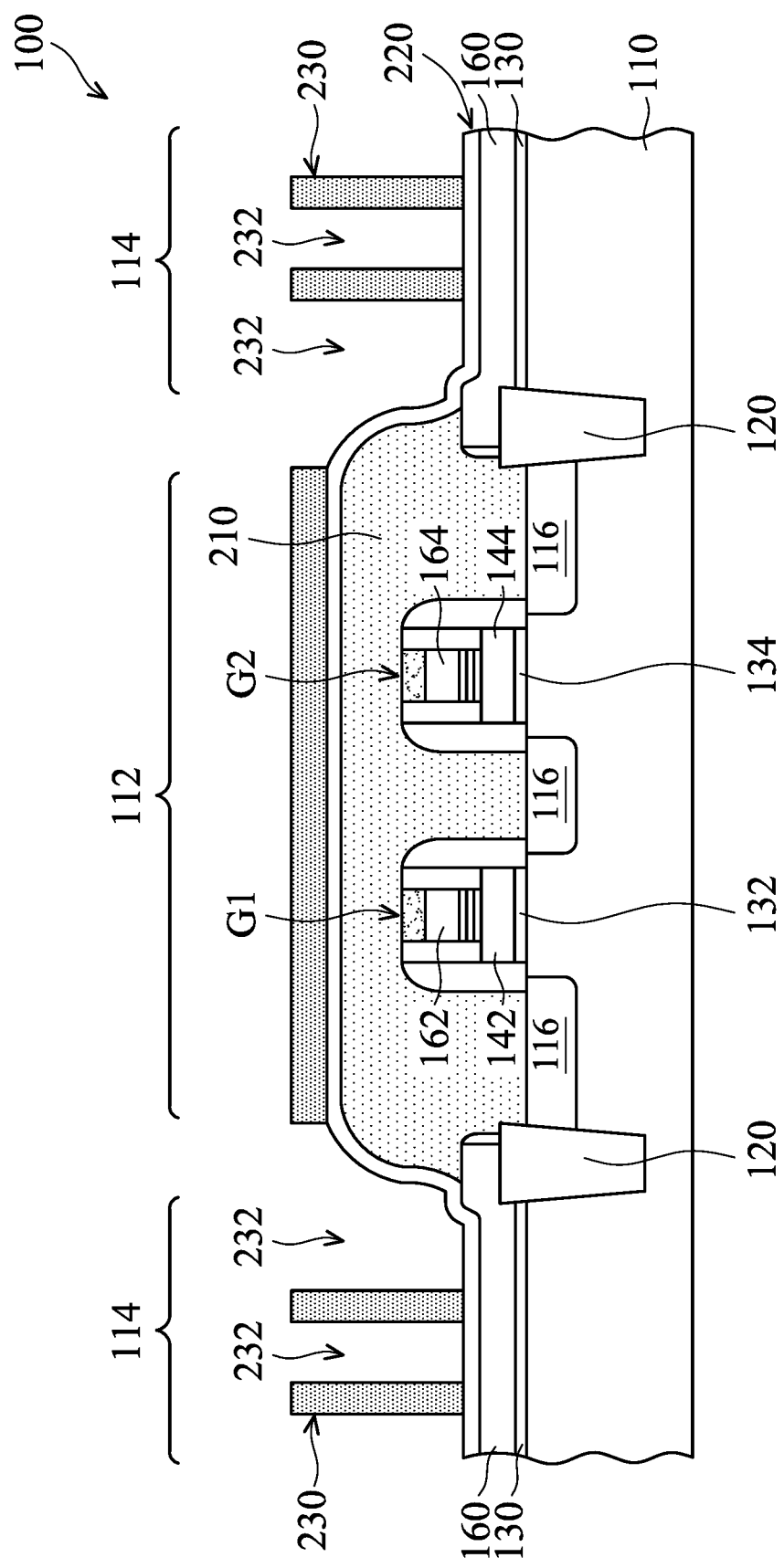

As shown in FIG. 1J, portions of the mask layer 230 are removed, in accordance with some embodiments. After the removal process, trenches 232 are formed in the mask layer 230 and expose portions of the anti-reflective layer 220 over the logic regions 114 and the isolation structure 120, in accordance with some embodiments. After the removal process, the mask layer 230 covers the negative photoresist layer 210 over the memory-cell region 112 and portions of the gate material layer 160 over the logic regions 114, in accordance with some embodiments.

Figure 1K:
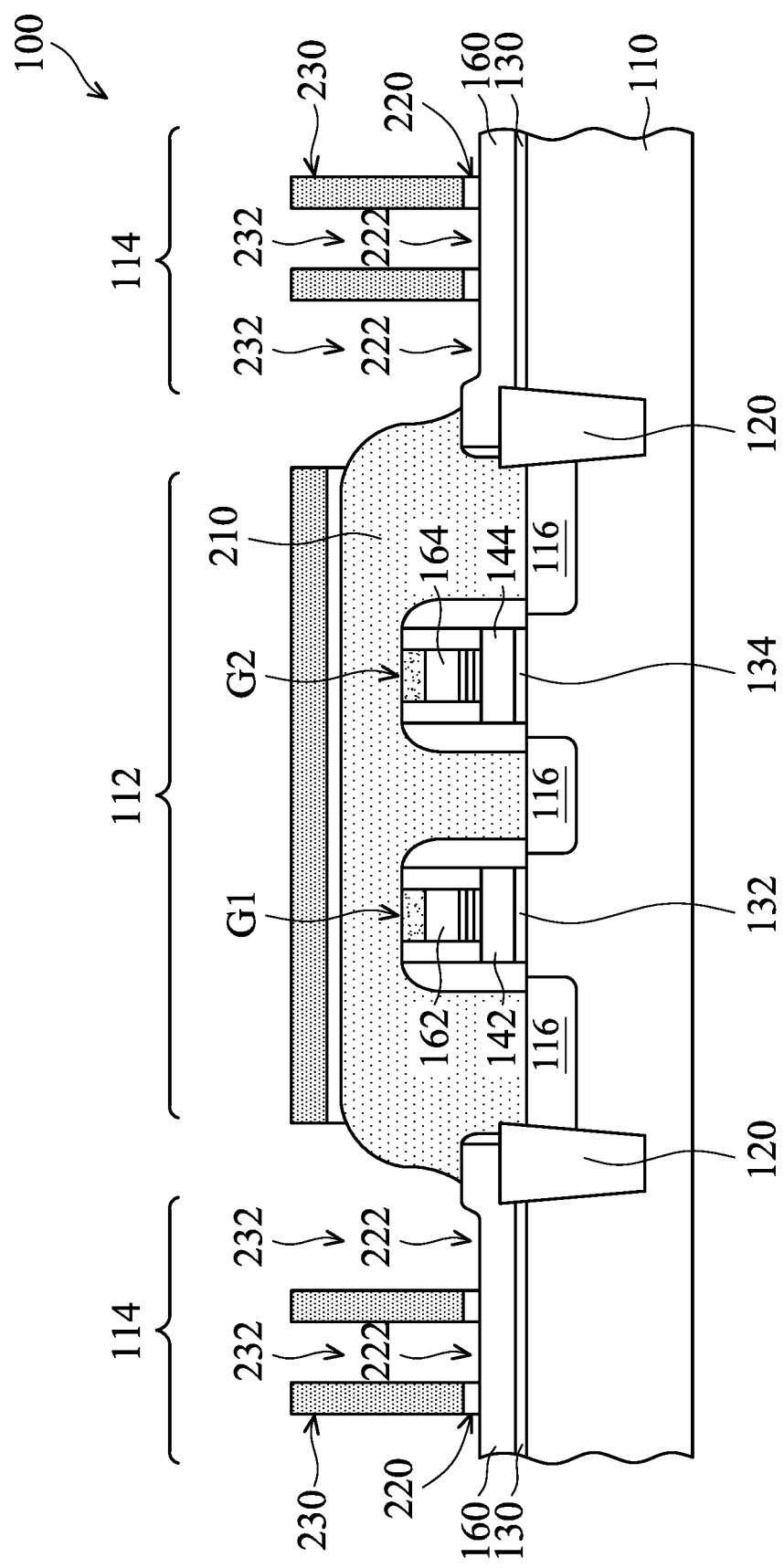

As shown in FIG. 1K, the anti-reflective layer 220 exposed by the trenches 232 is removed, in accordance with some embodiments. After the removal process, trenches 222 are formed in the anti-reflective layer 220 and expose portions of the gate material layer 160 over the logic regions 114, in accordance with some embodiments. The trenches 222 further expose the negative photoresist layer 210 over the isolation structure 120, in accordance with some embodiments. The removal process includes a dry etching process, in accordance with some embodiments.

Figure 1L:
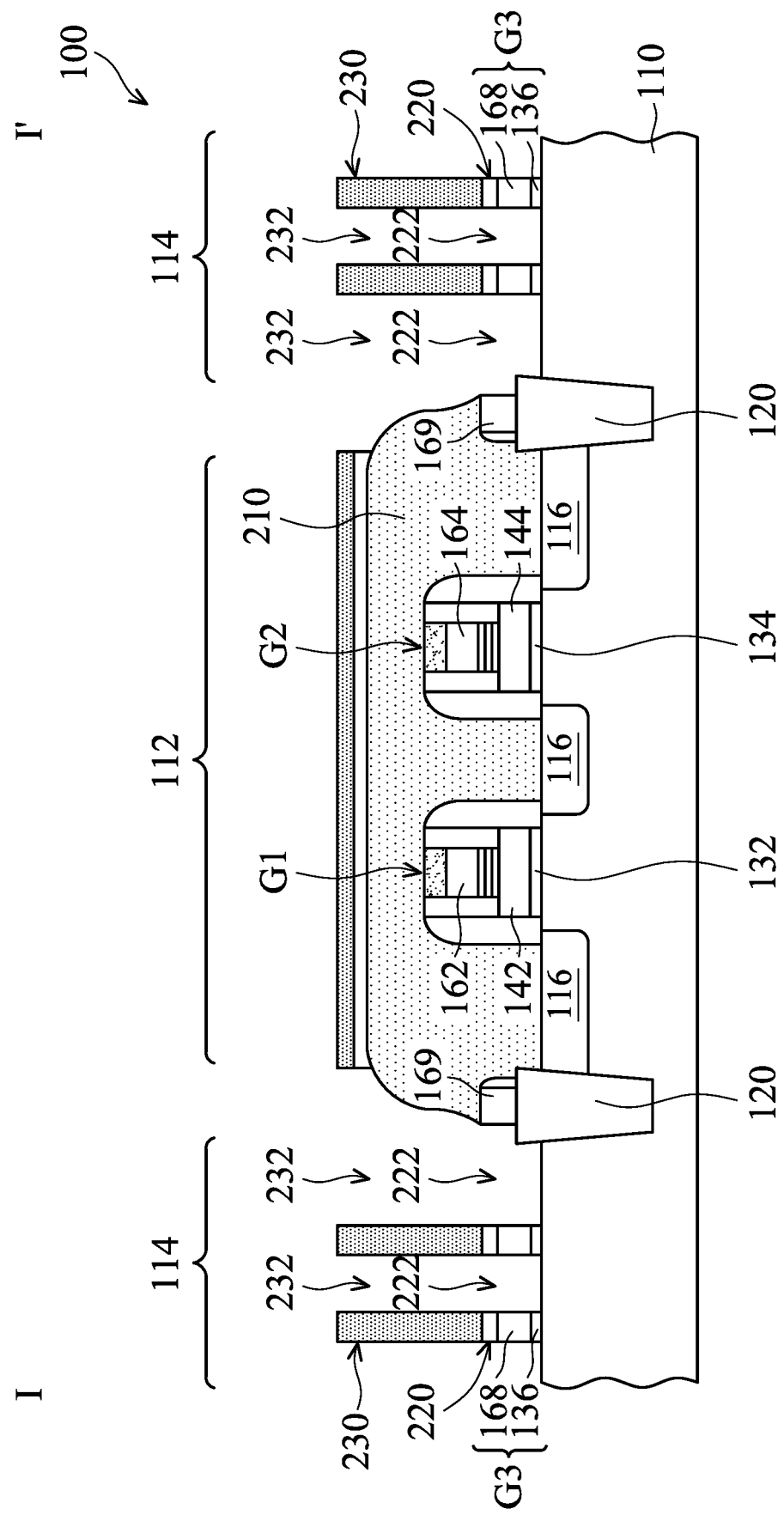
Figure 2B:
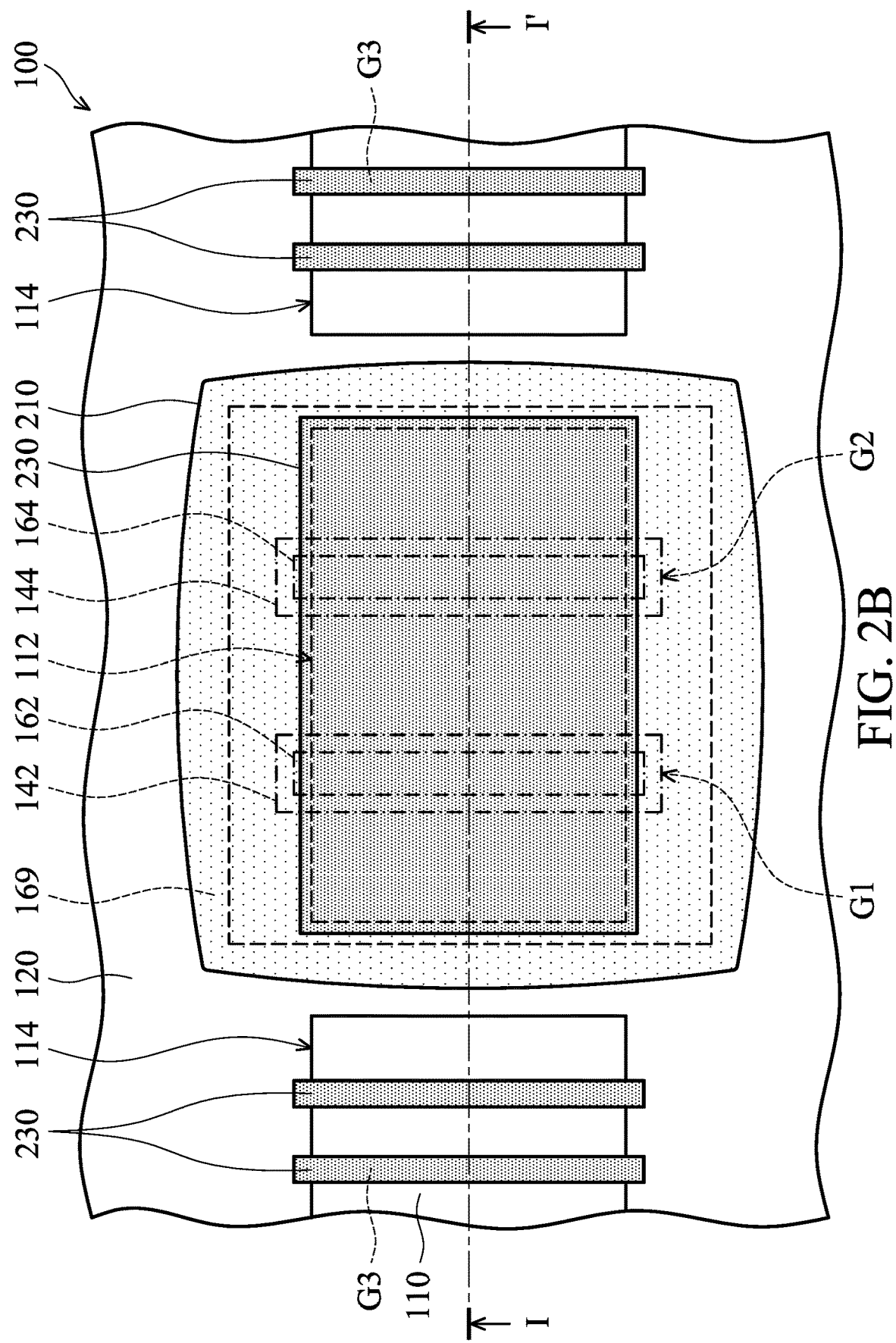
FIG. 2B is a top view of the semiconductor device structure of FIG. 1L, in accordance with some embodiments.

FIG. 2B is a top view of the semiconductor device structure of FIG. 1L, in accordance with some embodiments. FIG. 1L is a cross-sectional view illustrating the semiconductor device structure 100 along a sectional line I-I' in FIG. 2B, in accordance with some embodiments.

As shown in FIGS. 1L and 2B, portions of the gate material layer 160 and the gate dielectric material layer 130 exposed by the trenches 222 and 232 are removed, in accordance with some embodiments. After the removal process, the remaining gate material layer 160 and the remaining dielectric material layer 130 over the logic region 114 forms gates 168 and gate dielectric layers 136 under the gates 168 respectively, in accordance with some embodiments. The gate 168 is also referred to as a logic gate, in accordance with some embodiments. The gate 168 and the gate dielectric layer 136 thereunder together form a gate stack G3, in accordance with some embodiments.

The mask layer 230 may be thinned by the removal process. Since the mask layer 230 over the gate stacks G1 and G2 is thinner than the mask layer 230 over the logic region 114 before the removal process, the mask layer 230 over the gate stacks G1 and G2 may be removed by the removal process. Since the negative photoresist layer 210 covers the gate stacks G1 and G2, the negative photoresist layer 210 protects the gate stacks G1 and G2 from damage caused by the removal process, in accordance with some embodiments.

Since the protection of the negative photoresist layer 210, the removal process may be performed completely without damage concern of the gate stacks G1 and G2, which contributes to remove residues (from the anti-reflective layer 220, the mask layer 230, the gate material layer 160, and/or the dielectric material layer 130) completely. Therefore, the negative photoresist layer 210 improves the yield of the semiconductor device structure 100, in accordance with some embodiments.

As shown in FIGS. 1L and 2B, the remaining gate material layer 160 covered by the negative photoresist layer 210 remains over the isolation structure 120 and forms a ring structure 169, in accordance with some embodiments. Since the ring structure 169, the gate 168, and the control gates 162 and 164 are formed from the gate material layer 160, the ring structure 169, the gate 168, and the control gates 162 and 164 are made of the same conductive material, in accordance with some embodiments.

Figure 1M:
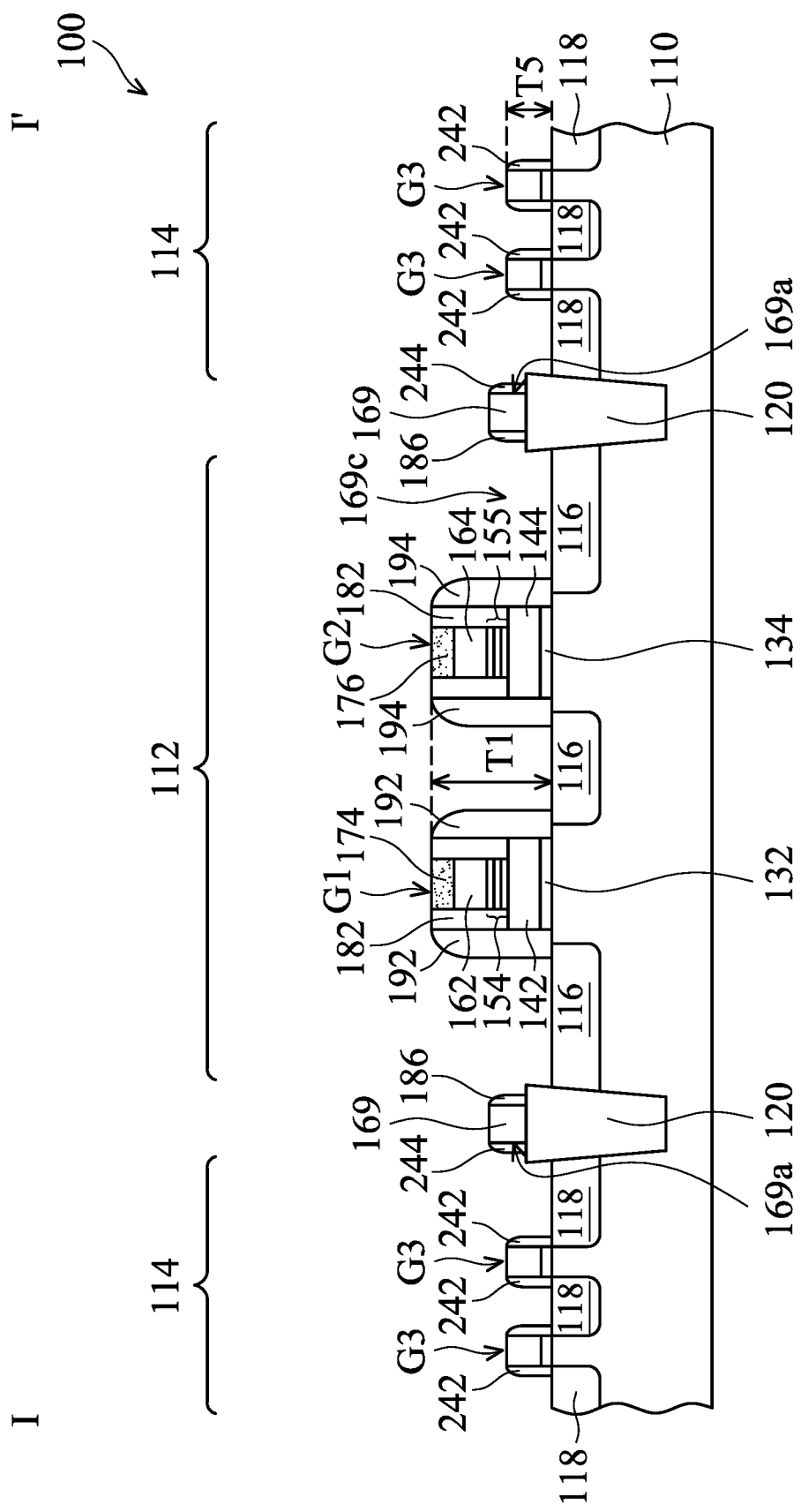
Figure 2C:
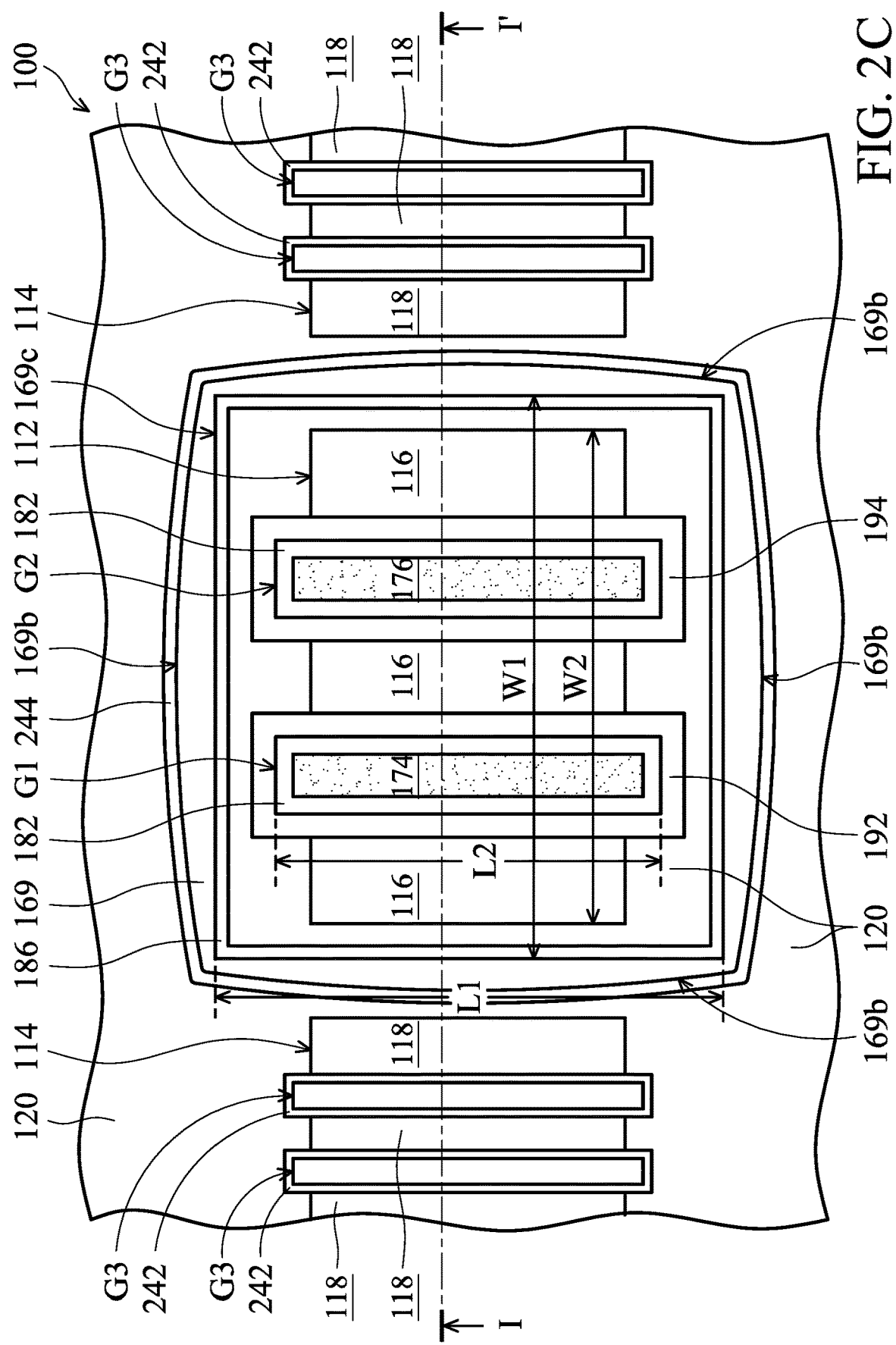
FIG. 2C is a top view of the semiconductor device structure of FIG. 1M, in accordance with some embodiments.

FIG. 2C is a top view of the semiconductor device structure 100 of FIG. 1M, in accordance with some embodiments. FIG. 1M is a cross-sectional view illustrating the semiconductor device structure 100 along a sectional line I-I' in FIG. 2C, in accordance with some embodiments.

As shown in FIGS. 1M and 2C, spacers 242 are formed over sidewalls of the gate stacks G3, in accordance with some embodiments. In some embodiments, a spacer 244 is formed over an outer sidewall 169a of the ring structure 169. The spacers 242 and 244 include oxide, such as silicon oxide, in accordance with some embodiments. The spacers 242 and 244 are formed using a deposition process and an etching process, in accordance with some embodiments. The etching process includes a dry etching process, in accordance with some embodiments.

As shown in FIGS. 1M and 2C, doped regions 118 are formed in the semiconductor substrate 110 in the logic region 114 and exposed by the gate stacks G3, in accordance with some embodiments. The doped regions 118 are doped with n-type impurities (e.g., phosphorus) or p-type impurities (e.g., boron), in accordance with some embodiments. The doped regions 118 are formed using, for example, an ion implantation process.

As shown in FIGS. 1M and 2C, the negative photoresist layer 210, the anti-reflective layer 220, and the mask layer 230 are removed, in accordance with some embodiments. The removal process includes a dry etching process, in accordance with some embodiments. The dry etching process includes an ashing process, in accordance with some embodiments.

The ring structure 169 surrounds the gate stacks G1 and G2, in accordance with some embodiments. The ring structure 169 surrounds the entire memory-cell region 112, in accordance with some embodiments. The ring structure 169 surrounds the entire memory-cell region 112, the entire gate stacks G1 and G2, and the entire spacers 192 and 194, in accordance with some embodiments. The ring structure 169 and the gate stacks G1 and G2 are spaced apart from each other, in accordance with some embodiments.

The ring structure 169 and the spacers 192 and 194 are spaced apart from each other, in accordance with some embodiments. The ring structure 169 and the memory-cell region 112 are spaced apart from each other, in accordance with some embodiments. The ring structure 169 and the logic region 114 are spaced apart from each other, in accordance with some embodiments. The ring structure 169 and the gate stacks G3 are spaced apart from each other, in accordance with some embodiments.

The ring structure 169 is between the gate stacks G3 and the gate stack G1 or G2, in accordance with some embodiments. The ring structure 169 is between the memory-cell region 112 and the logic region 114, in accordance with some embodiments. The ring structure 169 is a continuous ring structure, in accordance with some embodiments. The ring structure 169 has a curved outer edge 169b, in accordance with some embodiments.

The ring structure 169 has an opening 169c with a first width W1 that is greater than a second width W2 of the memory-cell region 112, in accordance with some embodiments. The opening 169c has a length L1 that is greater than a length L2 of the gate stack G1 or G2, in accordance with some embodiments. The thickness T1 of the gate stack G1 or G2 is greater than the thickness T5 of the gate stack G3, in accordance with some embodiments. The opening 169c exposes the entire memory cell region 112, in accordance with some embodiments.

In accordance with some embodiments, semiconductor device structures and methods for forming the same are provided. The methods (for forming the semiconductor device structure) form a negative photoresist layer to cover thicker gate stacks (or gate stacks with a greater height) before forming thinner gate stacks (or gate stacks with a smaller height). Therefore, the removal process for forming the thinner gate stacks is performed completely without damage concern of the thicker gate stacks, which contributes to remove residues completely. Therefore, the negative photoresist layer improves the yield of the semiconductor device structure.

In accordance with some embodiments, a method for forming a semiconductor device structure is provided. The method includes forming a gate stack and a conductive layer over a semiconductor substrate. The semiconductor substrate has a first region and a second region isolated from each other by an isolation structure in the semiconductor substrate, the gate stack is formed over the first region, and the conductive layer is formed over the second region and the isolation structure. The method includes forming a negative photoresist layer to cover the gate stack and a first portion of the conductive layer over the isolation structure and expose a second portion of the conductive layer. The method includes forming a mask layer over the negative photoresist layer and the conductive layer. The mask layer has trenches over the second portion of the conductive layer and an edge portion of the negative photoresist layer, and a thickness of the edge portion decreases in a direction away from the gate stack.

In accordance with some embodiments, a method for forming a semiconductor device structure is provided. The method includes forming a gate stack and a conductive layer over a semiconductor substrate. The semiconductor substrate has a first region and a second region isolated from each other by an isolation structure in the semiconductor substrate, the gate stack is formed over the first region, and the conductive layer is formed over the second region and the isolation structure. The method includes forming a negative photoresist material layer over the gate stack. The negative photoresist material layer and the conductive layer are spaced apart from each other. The method includes performing a baking process on the negative photoresist material layer to solidify the negative photoresist material layer into a negative photoresist layer. The negative photoresist material layer partially flows onto a first portion of the conductive layer during the baking process, and the negative photoresist layer over the first portion of the conductive layer has a curved sidewall.

In accordance with some embodiments, a method for forming a semiconductor device structure is provided. The method includes forming a gate stack and a conductive layer over a semiconductor substrate. The semiconductor substrate has a first region and a second region isolated from each other by an isolation structure in the semiconductor substrate, the gate stack is formed over the first region, and the conductive layer is formed over the second region and the isolation structure. The method includes forming a negative photoresist layer over the gate stack and a first portion of the conductive layer over the isolation structure. The method includes forming a mask layer over the negative photoresist layer and the conductive layer. The mask layer has trenches over a second portion of the conductive layer. The method includes removing the second portion through the trenches, after the second portion is removed through the trenches, the first portion of the conductive layer under the negative photoresist layer remains and forms a ring structure, and the ring structure surrounds the first region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a gate stack and a conductive layer over a semiconductor substrate, wherein the semiconductor substrate has a first region and a second region isolated from each other by an isolation structure in the semiconductor substrate, the gate stack is formed over the first region, and the conductive layer is formed over the second region and the isolation structure;
    forming a negative photoresist layer to cover the gate stack and a first portion of the conductive layer over the isolation structure and expose a second portion of the conductive layer; and
    forming a mask layer over the negative photoresist layer and the conductive layer, wherein the mask layer has trenches over the second portion of the conductive layer and an edge portion of the negative photoresist layer, and a thickness of the edge portion decreases in a direction away from the gate stack.

2. The method for forming a semiconductor device structure as claimed in claim 1, further comprising:
    removing the second portion through the trenches after forming the mask layer over the negative photoresist layer and the conductive layer;
    removing the mask layer; and
    removing the negative photoresist layer.

3. The method for forming a semiconductor device structure as claimed in claim 2, wherein the mask layer over the conductive layer is thicker than the mask layer over the negative photoresist layer.

4. The method for forming a semiconductor device structure as claimed in claim 2, wherein after the removing of the second portion, the first portion of the conductive layer covered by the negative photoresist layer remains over the isolation structure.

5. The method for forming a semiconductor device structure as claimed in claim 1, wherein the edge portion of the negative photoresist layer overlaps the first portion of the conductive layer and the isolation structure.

6. The method for forming a semiconductor device structure as claimed in claim 1, wherein the thickness of the edge portion continuously decreases in the direction away from the gate stack.

7. The method for forming a semiconductor device structure as claimed in claim 1, wherein one of the trenches exposes the edge portion and the second portion.

8. The method for forming a semiconductor device structure as claimed in claim 1, wherein the first portion covered by the edge portion has a ring shape.

9. The method for forming a semiconductor device structure as claimed in claim 8, wherein the first portion covered by the edge portion continuously surrounds the gate stack.

10. The method for forming a semiconductor device structure as claimed in claim 1, wherein the forming of the negative photoresist layer comprises:
    forming a negative photoresist material layer over the first region to cover the gate stack; and
    performing a baking process on the negative photoresist material layer.

11. A method for forming a semiconductor device structure, comprising:
    forming a gate stack and a conductive layer over a semiconductor substrate, wherein the semiconductor substrate has a first region and a second region isolated from each other by an isolation structure in the semiconductor substrate, the gate stack is formed over the first region, and the conductive layer is formed over the second region and the isolation structure;
    forming a negative photoresist material layer over the gate stack, wherein the negative photoresist material layer and the conductive layer are spaced apart from each other; and performing a baking process on the negative photoresist material layer to solidify the negative photoresist material layer into a negative photoresist layer, wherein the negative photoresist material layer partially flows onto a first portion of the conductive layer during the baking process, and the negative photoresist layer over the first portion of the conductive layer has a curved sidewall.

12. The method for forming a semiconductor device structure as claimed in claim 11, wherein the negative photoresist layer covers the gate stack and the first portion.

13. The method for forming a semiconductor device structure as claimed in claim 12, further comprising:
    forming a mask layer over the negative photoresist layer and the conductive layer, wherein the mask layer has trenches over a second portion of the conductive layer;
    removing the second portion through the trenches;
    removing the mask layer; and
    removing the negative photoresist layer.

14. The method for forming a semiconductor device structure as claimed in claim 13, wherein one of the trenches exposes a portion of the negative photoresist layer.

15. The method for forming a semiconductor device structure as claimed in claim 14, wherein the one of the trenches exposes the curved sidewall.

16. A method for forming a semiconductor device structure, comprising:
    forming a gate stack and a conductive layer over a semiconductor substrate, wherein the semiconductor substrate has a first region and a second region isolated from each other by an isolation structure in the semiconductor substrate, the gate stack is formed over the first region, and the conductive layer is formed over the second region and the isolation structure;
    forming a negative photoresist layer over the gate stack and a first portion of the conductive layer over the isolation structure;
    forming a mask layer over the negative photoresist layer and the conductive layer, wherein the mask layer has trenches over a second portion of the conductive layer; and
    removing the second portion through the trenches, wherein after the second portion is removed through the trenches, the first portion of the conductive layer under the negative photoresist layer remains and forms a ring structure, and the ring structure surrounds the first region.

17. The method for forming a semiconductor device structure as claimed in claim 16, further comprising:
    removing the mask layer after removing the second portion through the trenches; and
    removing the negative photoresist layer.

18. The method for forming a semiconductor device structure as claimed in claim 16, wherein the entire ring structure is over the isolation structure.

19. The method for forming a semiconductor device structure as claimed in claim 16, further comprising:
    forming a spacer over a sidewall of the ring structure after removing the second portion through the trenches.

20. The method for forming a semiconductor device structure as claimed in claim 19, wherein the entire spacer is over the isolation structure.

* * * * *